(12) United States Patent
Liu et al.

(10) Patent No.: US 11,946,993 B2
(45) Date of Patent: Apr. 2, 2024

(54) IMAGING METHOD AND SYSTEM

(71) Applicant: SHANGHAI UNITED IMAGING HEALTHCARE CO., LTD., Shanghai (CN)

(72) Inventors: Qi Liu, Houston, TX (US); Jian Xu, Houston, TX (US)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 0 days.

(21) Appl. No.: 17/817,976

(22) Filed: Aug. 5, 2022

(65) Prior Publication Data
US 2024/0045012 A1  Feb. 8, 2024

(51) Int. Cl.
 *G01V 3/00* (2006.01)
 *G01R 33/48* (2006.01)
 *G01R 33/56* (2006.01)

(52) U.S. Cl.
 CPC ..... *G01R 33/5605* (2013.01); *G01R 33/4828* (2013.01)

(58) Field of Classification Search
 CPC .............. G01R 33/3415; G01R 33/543; G01R 33/5659; G01R 33/36; A61B 5/055
 USPC ........................................................ 324/309
 See application file for complete search history.

(56) References Cited

U.S. PATENT DOCUMENTS

| | | | |
|---|---|---|---|
| 10,436,871 B2 | 10/2019 | Li et al. | |
| 2004/0142496 A1* | 7/2004 | Nicholson | G01R 33/4625 436/536 |
| 2014/0070803 A1* | 3/2014 | Jin | G01R 33/54 324/309 |
| 2015/0192721 A1* | 7/2015 | El-Kady | H01Q 15/0086 359/352 |

FOREIGN PATENT DOCUMENTS

WO    WO-2020097129 A1 *   5/2020    ........... A61B 5/0022

OTHER PUBLICATIONS

Wu, B. et al., An Overview of CEST MRI for Non-MR Physicists, EJNMMI Physics, 2016, 21 pages.
(Continued)

*Primary Examiner* — Walter L Lindsay, Jr.
*Assistant Examiner* — Frederick Wenderoth
(74) *Attorney, Agent, or Firm* — METIS IP LLC

(57) ABSTRACT

The present disclosure may provide imaging method and system. The method may include obtaining a plurality of signals relating to a region of interest (ROI) of an object acquired by applying to the object a plurality of chemical exchange and saturation transfer (CEST) preparations with a plurality of offset frequencies; and generating an image of the ROI based on the plurality of signals. The plurality of CEST preparations may be configured to excite proton exchange of a substance in the ROI. The plurality of CEST preparations may be divided into one or more groups. Each of the one or more groups may include multiple CEST preparations with a same offset frequency among the plu- (Continued)

rality of offset frequencies. After a last CEST preparation in each of the one or more groups is applied to the object, the substance may reach a saturation degree that exceeds a saturation threshold.

19 Claims, 9 Drawing Sheets

(56) References Cited

OTHER PUBLICATIONS

Liu, Guanshu et al., Nuts and Bolts of Chemical Exchange Saturation Transfer MRI, NMR in Biomedicine, 26(7): 810-828, 2013.
Zhou, Zhengwei et al., Optimized CEST Cardiovascular Magnetic Resonance for Assessment of Metabolic Activity in the Heart, Journal of Cardiovascular Magnetic Resonance, 2017, 7 pages.
Moriel Vandsburger et al., Cardio-Chemical Exchange Saturation Transfer Magnetic Resonance Imaging Reveals Molecular Signatures of Endogenous Fibrosis and Exogenous Contrast Media, Circulation: Cardiovascular Imaging, 2014, 8 pages.
Jaime L. Shaw et al., Free-Breathing, Non-ECG, Continuous Myocardial T1 Mapping with Cardiovascular Magnetic Resonance Multitasking, Magnetic Resonance in Medicine, 81(4): 2450-2463, 2019.
Anthony G. Christodoulou et al., Magnetic Resonance Multitasking for Motion-Resolved Quantitative Cardiovascular Imaging, Nature Biomedical Engineering, 2(4): 215-226, 2018.

* cited by examiner

600

| Obtaining a plurality of signals relating to a region of interest (ROI) of an object acquired by applying to the object a plurality of CEST preparations with a plurality of offset frequencies | ∼ 610 |

| Generating an image of the ROI based on the plurality of signals | ∼ 620 |

FIG. 6

IMAGING METHOD AND SYSTEM

TECHNICAL FIELD

The present disclosure generally relates to magnetic resonance (MR), and more particularly, relates to a method and system for MR imaging.

BACKGROUND

Chemical exchange saturation transfer (CEST) imaging is a contrast mechanism in magnetic resonance imaging (MRI). The CEST imaging may include detecting chemical exchange between an exogenous or endogenous substance containing either exchangeable protons or exchangeable molecules and water inside an object. The quality of the CEST imaging may be affected by factors including, e.g., a phycological or physical motion (e.g., a cardiac motion, a respiratory motion), a $T_1$ relaxation related factor, etc., of the object, a concentration of the exogenous or endogenous substance, etc. Thus, it is desirable to provide a method and system for improving the quality of the CEST imaging.

SUMMARY

According to one aspect of the present disclosure, a system may be provided. The system may include: at least one storage device including a set of instructions; at least one processor in communication with the at least one storage device, wherein when executing the set of instructions, the at least one processor may be configured to cause the system to perform operations including: obtaining a plurality of signals relating to a region of interest (ROI) of an object acquired by applying to the object a plurality of chemical exchange and saturation transfer (CEST) preparations with a plurality of offset frequencies; and generating an image of the ROI based on the plurality of signals. The plurality of CEST preparations may be configured to excite proton exchange of a substance in the ROI. The plurality of CEST preparations may be divided into one or more groups. Each of the one or more groups may include multiple CEST preparations with a same offset frequency among the plurality of offset frequencies. After a last CEST preparation in each of the one or more groups is applied to the object, the substance may reach a saturation degree that exceeds a saturation threshold.

In some embodiments, the plurality of offset frequencies of the CEST preparations may be within one or more discrete frequency ranges.

In some embodiments, the one or more discrete frequency ranges may include at least one of: a frequency range centered at or containing a resonant frequency of the substance, a frequency range centered at or containing a negative value of the resonant frequency of the substance, or a frequency range whose characteristic frequency is different from a resonant frequency of water by a threshold frequency.

In some embodiments, the one or more discrete frequency ranges may exclude a frequency range centered at or containing a resonant frequency of water.

In some embodiments, the plurality of offset frequencies may exclude a resonant frequency of water.

In some embodiments, the applying to the object a plurality of CEST preparations with a plurality of offset frequencies may include: after multiple CEST preparations in one of the one or more groups are applied, applying multiple CEST preparations in another group of the one or more groups.

In some embodiments, a duration of the CEST preparation may be smaller than a threshold.

In some embodiments, the threshold may be lower than a characteristic time of a physiological motion of the ROI.

In some embodiments, each of the plurality of CEST preparations may include at least one of a spoiled gradient-recalled echo (GRE) sequence, a fast GRE, a gradient recalled acquisition in steady state (GRASS) sequence, a steady-state free precession (SSFP) sequence, a double echo steady state (DESS) sequence, or a magnetization-prepared gradient-recalled echo (MP-GRE) sequence.

In some embodiments, the ROI of the object may include at least one of a heart, a head, a lung, a lumbar disc, a nerve, articular cartilage, an intervertebral disc, or a shoulder of the object.

In some embodiments, the substance in the ROI may include at least one of creatine in the heart, acylamino in the head, glutamic acid (Glu) in the nerve, or glycosaminoglycan (GAG) in the cartilage.

In some embodiments, the plurality of signals relating to the ROI may be acquired based on a multitasking technique.

In some embodiments, the acquisition of a plurality of signals relating to an ROI of an object by applying to the object a plurality of CEST preparations with a plurality of offset frequencies may include: after each of the plurality of CEST preparations is applied to the object, acquiring multiple signal pairs of the plurality of signals. Each signal pair may include at least one first signal and at least one second signal. The at least one first signal may be used to estimate temporal information of the ROI of the object during the acquisition of the plurality of signals. The at least one second signal may correspond to image data for generating the image of the ROI.

In some embodiments, each CEST preparation of at least one of the plurality of CEST preparations may include a double echo sequence. Each of at least one of the multiple signal pairs may include two first signals and two second signals acquired in response to the double echo sequence.

In some embodiments, the generating an image of the ROI based on the plurality of signals may include: determining a tensor relating to the ROI based on the plurality of signals; and generating the image of the ROI based on the tensor.

In some embodiments, the tensor may include at least one of a first component representing an echo dimension of each CEST preparation, a second component representing a pixel matrix of the image, a third component representing a count of the plurality of offset frequencies, or a fourth component representing a count of multiple CEST preparations in each of the one or more groups.

In some embodiments, the generating the image of the ROI based on the tensor may include: generating a $B_0$ map based on the tensor; and generating the image of the ROI based on the $B_0$ map and the tensor.

In some embodiments, the generating a $B_0$ map based on the tensor may include: determining a first phase difference between the at least one first signal and a second phase difference between the at least one second signal of each of the at least one of the multiple signal pairs acquired after the each CEST preparation is applied; and generating the $B_0$ map based on the first phase differences, the second phase differences, the second component, the third component, and the fourth component.

In some embodiments, the tensor may further include at least one of: a fifth component representing a count of cardiac phases of a cardiac cycle of the object, or a sixth component representing a count of respiratory phases of a respiratory cycle of the object.

In some embodiments, the generating a $B_0$ map based on the tensor may include: determining a first phase difference between the at least one first signal and a second phase difference between the at least one second signal of each of the at least one of the multiple signal pairs acquired after the each CEST preparation is applied; generating an averaging result by averaging reference $B_0$ maps that are determined based on values of the fifth component and reference $B_0$ maps that are determined based on values of the sixth component; and generating the $B_0$ map based on the first phase differences, the second phase differences, the second component, the third component, the fourth component, and the averaging result.

In some embodiments, the generating the image of the ROI based on the $B_0$ map and the tensor may include: correcting, based on the $B_0$ map, a magnetization transfer ratio asymmetry ($MTR_{asym}$) relating to the ROI; and generating the image based on the corrected $MTR_{asym}$.

In some embodiments, the correcting, based on the $B_0$ map, a magnetization transfer ratio asymmetry ($MTR_{asym}$) relating to the ROI may include: determining multiple deviation values relating to multiple reference offset frequencies based on the $B_0$ map; determining multiple target offset frequencies among the plurality of offset frequencies based on the multiple deviation values and the multiple reference offset frequencies, each of the multiple target offset frequencies being equal to a sum of one of the multiple reference offset frequencies and a deviation value corresponding to the reference offset frequency; and correcting the $MTR_{asym}$ relating to the ROI based on the multiple target offset frequencies and multiple signals corresponding to the multiple target offset frequencies among the plurality of signals.

In some embodiments, each of the multiple signals corresponding to one of the multiple target offset frequencies may include a signal acquired after the application to the object the last CEST preparation of the target offset frequency.

According to an aspect of the present disclosure, a method may be implemented on a computing device having at least one processor and at least one storage device. The method may include obtaining a plurality of signals relating to a region of interest (ROI) of an object acquired by applying to the object a plurality of chemical exchange and saturation transfer (CEST) preparations with a plurality of offset frequencies; and generating an image of the ROI based on the plurality of signals. The plurality of CEST preparations may be configured to excite proton exchange of a substance in the ROI. The plurality of CEST preparations may be divided into one or more groups. Each of the one or more groups may include multiple CEST preparations with a same offset frequency among the plurality of offset frequencies. After a last CEST preparation in each of the one or more groups is applied to the object, the substance may reach a saturation degree that exceeds a saturation threshold.

In some embodiments, the plurality of offset frequencies of the CEST preparations may be within one or more discrete frequency ranges.

In some embodiments, the one or more discrete frequency ranges may include at least one of: a frequency range centered at or containing a resonant frequency of the substance, a frequency range centered at or containing a negative value of the resonant frequency of the substance, or a frequency range whose characteristic frequency is different from a resonant frequency of water by a threshold frequency.

In some embodiments, the one or more discrete frequency ranges may exclude a frequency range centered at or containing a resonant frequency of water.

In some embodiments, the plurality of offset frequencies may exclude a resonant frequency of water.

In some embodiments, the applying to the object a plurality of CEST preparations with a plurality of offset frequencies may include: after multiple CEST preparations in one of the one or more groups are applied, applying multiple CEST preparations in another group of the one or more groups.

In some embodiments, a duration of the CEST preparation may be smaller than a threshold.

In some embodiments, the threshold may be lower than a characteristic time of a physiological motion of the ROI.

In some embodiments, each of the plurality of CEST preparations may include at least one of a spoiled gradient-recalled echo (GRE) sequence, a fast GRE sequence, a gradient recalled acquisition in steady state (GRASS) sequence, a steady-state free precession (SSFP) sequence, a double echo steady state (DESS) sequence, or a magnetization-prepared gradient-recalled echo (MP-GRE) sequence.

In some embodiments, the ROI of the object may include at least one of a heart, a head, a lung, a lumbar disc, a nerve, articular cartilage, an intervertebral disc, or a shoulder of the object.

In some embodiments, the substance in the ROI may include at least one of creatine in the heart, acylamino in the head, glutamic acid (Glu) in the nerve, or glycosaminoglycan (GAG) in the cartilage.

In some embodiments, the method may include acquiring the plurality of signals relating to the ROI base on a multitasking technique.

In some embodiments, the acquisition of a plurality of signals relating to an ROI of an object by applying to the object a plurality of CEST preparations with a plurality of offset frequencies may include: after each of the plurality of CEST preparations is applied to the object, acquiring multiple signal pairs of the plurality of signals. Each signal pair may include at least one first signal and at least one second signal. The at least one first signal may be used to estimate temporal information of the ROI of the object during the acquisition of the plurality of signals. The at least one second signal may correspond to image data for generating the image of the ROI.

In some embodiments, each CEST preparation of at least one of the plurality of CEST preparations may include a double echo sequence. Each of at least one of the multiple signal pairs may include two first signals and two second signals acquired in response to the double echo sequence.

In some embodiments, the generating an image of the ROI based on the plurality of signals may include determining a tensor relating to the ROI based on the plurality of signals; and generating the image of the ROI based on the tensor.

In some embodiments, the tensor may include at least one of a first component representing an echo dimension of each CEST preparation, a second component representing a pixel matrix of the image, a third component representing a count of the plurality of offset frequencies, or a fourth component representing a count of multiple CEST preparations in each of the one or more groups.

In some embodiments, the generating the image of the ROI based on the tensor may include: generating a $B_0$ map based on the tensor; and generating the image of the ROI based on the $B_0$ map and the tensor.

In some embodiments, the generating a $B_0$ map based on the tensor may include: determining a first phase difference between the at least one first signal and a second phase difference between the at least one second signal of each of the at least one of the multiple signal pairs acquired after the each CEST preparation is applied; and generating the $B_0$ map based on the first phase differences, the second phase differences, the second component, the third component, and the fourth component.

In some embodiments, the tensor may further include at least one of: a fifth component representing a count of cardiac phases of a cardiac cycle of the object, or a sixth component representing a count of respiratory phases of a respiratory cycle of the object.

In some embodiments, the generating a $B_0$ map based on the tensor may include determining a first phase difference between the at least one first signal and a second phase difference between the at least one second signal of each of the at least one of the multiple signal pairs acquired after the each CEST preparation is applied; generating an averaging result by averaging reference $B_0$ maps that are determined based on values of the fifth component and reference $B_0$ maps that are determined based on values of the sixth component; and generating the $B_0$ map based on the first phase differences, the second phase differences, the second component, the third component, the fourth component, and the averaging result.

In some embodiments, the generating the image of the ROI based on the $B_0$ map and the tensor may include: correcting, based on the $B_0$ map, a magnetization transfer ratio asymmetry ($MTR_{asym}$) relating to the ROI; and generating the image based on the corrected $MTR_{asym}$.

In some embodiments, the correcting, based on the $B_0$ map, a magnetization transfer ratio asymmetry ($MTR_{asym}$) relating to the ROI may include: determining multiple deviation values relating to multiple reference offset frequencies based on the $B_0$ map; determining multiple target offset frequencies among the plurality of offset frequencies based on the multiple deviation values and the multiple reference offset frequencies, each of the multiple target offset frequencies being equal to a sum of one of the multiple reference offset frequencies and a deviation value corresponding to the reference offset frequency; and correcting the $MTR_{asym}$ relating to the ROI based on the multiple target offset frequencies and multiple signals corresponding to the multiple target offset frequencies among the plurality of signals.

In some embodiments, each of the multiple signals corresponding to one of the multiple target offset frequencies may include a signal acquired after the application to the object the last CEST preparation of the target offset frequency.

According to an aspect of the present disclosure, a non-transitory computer readable medium may be provided. The non-transitory computer readable medium may include at least one set of instructions, wherein when executed by at least one processor of a computing device, the at least one set of instructions may cause the at least one processor to effectuate a method comprising: obtaining a plurality of signals relating to a region of interest (ROI) of an object acquired by applying to the object a plurality of chemical exchange and saturation transfer (CEST) preparations with a plurality of offset frequencies; and generating an image of the ROI based on the plurality of signals. The plurality of CEST preparations may be configured to excite proton exchange of a substance in the ROI. The plurality of CEST preparations may be divided into one or more groups. Each of the one or more groups may include multiple CEST preparations with a same offset frequency among the plurality of offset frequencies. After a last CEST preparation in each of the one or more groups is applied to the object, the substance may reach a saturation degree that exceeds a saturation threshold.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein:

FIG. 6 is a flowchart illustrating an exemplary imaging process according to some embodiments of the present disclosure;

DETAILED DESCRIPTION

Figure 1:
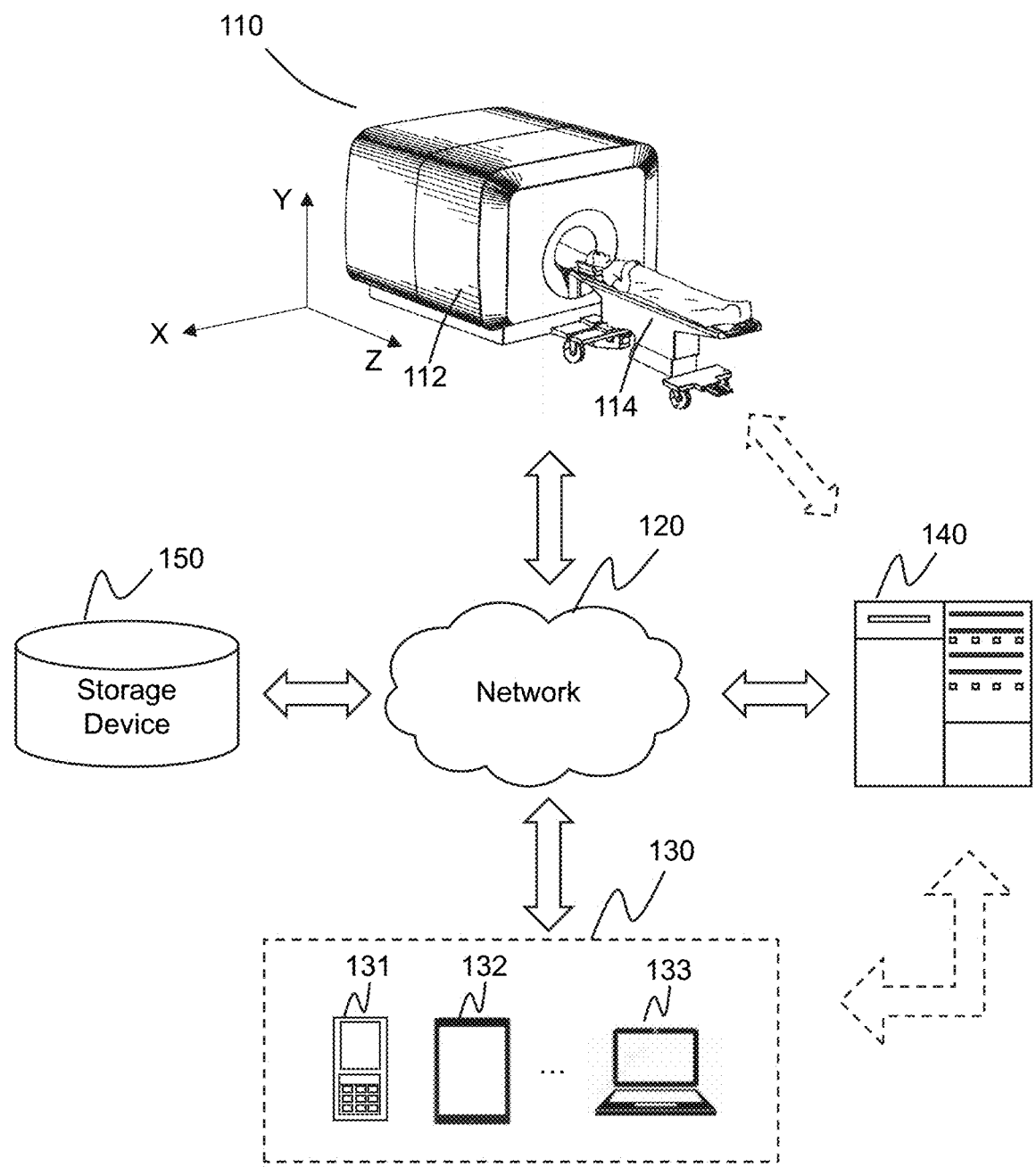
FIG. 1 is a schematic diagram illustrating an exemplary MRI system according to some embodiments of the present disclosure.

The following description is presented to enable any person skilled in the art to make and use the present disclosure and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown but is to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including" when used in this disclosure, specify the presence of stated features, integers, steps, operations, elements, and/or components, but do not preclude the presence or addition of one or more other features, integers, steps, operations, elements, components, and/or groups thereof.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or other storage devices. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an erasable programmable read-only memory (EPROM). It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that the term "system," "engine," "unit," "module," and/or "block" used herein are one method to distinguish different components, elements, parts, sections or assembly of different levels in ascending order. However, the terms may be displaced by another expression if they achieve the same purpose.

It will be understood that when a unit, engine, module, or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

The term "pixel" and "voxel" in the present disclosure may be used interchangeably to refer to an element in an image. The term "image" in the present disclosure may be used to refer to images of various forms, including a 2-dimensional (2D) image, a 3-dimensional (3D) image, a 4-dimensional (4D) image, etc.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments in the present disclosure. It is to be expressly understood, the operations of the flowchart may be implemented not in order. Conversely, the operations may be implemented in an inverted order, or simultaneously. Moreover, one or more other operations may be added to the flowcharts. One or more operations may be removed from the flowcharts.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnetic resonance imaging system, a non-superconducting magnetic resonance imaging system, etc. The multi-modality imaging system may include, for example, a magnetic resonance-computed tomography imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. In some embodiments, the medical system may include a treatment system. The treatment system may include a treatment plan system (TPS), image-guide radiotherapy (IGRT), etc. The image-guide radiotherapy (IGRT) may include a treatment device and an imaging device. The treatment device may include a linear accelerator, a cyclotron, a synchrotron, etc., configured to perform a radio therapy on an object. The treatment device may include an accelerator of species of particles including, for example, photons, electrons, protons, or heavy ions. The imaging device may include an MRI scanner.

A chemical exchange and saturation transfer (CEST) imaging may involve a substance including either exchangeable protons or exchangeable molecules of an object. A radiofrequency (RF) pulse may be applied to the object at a particular frequency (e.g., a resonant frequency of the substance, a negative value of the resonant frequency of the substance, a frequency far from a resonant frequency of pure water (e.g., 0 ppm) to allow the substance to reach a magnetic saturation state. For example, in the magnetic saturation state, the substance may show no net magnetization. Magnetically saturated protons or molecules (or referred to as excited protons or molecules) of the substance may exchange with non-saturated protons of free water, causing protons of a portion of water to be magnetically saturated. Since the magnetically saturated protons of water may cause water to lose resonance at the resonant frequency of pure water without the exchanged protons, an intensity of an MR signal generated by the water without the exchanged protons may be reduced. The reduction in the MR signal may indicate a concentration of the substance and/or an anatomy of the object. The reduction of the MR signal may also be referred to as a CEST effect. The higher the reduction of the MR signal is, the stronger the CEST effect may be. Magnetization may be spontaneously transferred from the substance to water over time during the chemical exchange. The reduction of the MR signal may be characterized by a magnetic transfer ratio asymmetry ($MTR_{asym}$).

A multitasking technique may be a continuous-acquisition framework that can simultaneously resolve many dynamics such as physiological dynamics (e.g., a cardiac motion, a respiratory motion), physical dynamics (e.g., $T_1$ relaxation, $T_2$ relaxation), etc. The multitasking technique may conceptualize different sources of dynamics as different time dimensions, which can be resolved via a low-rank tensor (LRT) imaging technique (e.g., an LRT imaging model). The multitasking technique may capture rather than avoid a motion, relaxation, or other dynamics to efficiently perform quantitative imaging (e.g., quantitative cardiac imaging, quantitative cardiovascular imaging) without the use of ECG triggering, breath holds, etc.

According to some embodiments of the present disclosure, a method combining the CEST imaging and the multitasking technique may be provided. A plurality of signals relating to a region of interest (ROI) of an object may be acquired by applying a plurality of CEST preparations to the object. The plurality of CEST preparations may be configured to excite proton exchange of a substance in the ROI. An image may be generated based on the plurality of signals.

In some embodiments, after the application of each of the plurality of CEST preparations to the object, at least one first signal and at least one second signal may be alternatively acquired for multiple times. The at least one first signal (or referred to as navigation signal), may be used to estimate temporal information of the ROI of the object during the acquisition of the plurality of signals. In some embodiments, the temporal information may be used to assess a motion of the ROI during the acquisition of the plurality of signals. The at least one second signal may correspond to image data for generating the image of the ROI. By combining the multitasking technique with the CEST imaging, the motion of the object may be monitored without using ECG triggering, breath holds, etc. Motion information so acquired may be used in image reconstruction to alleviate the affect of motion on an image of the ROI.

In some embodiments, the plurality of CEST preparations may be configured based on a plurality of offset frequencies. The plurality of offset frequencies may be within one or more discrete frequency ranges. The one or more discrete frequency ranges may include a frequency range centered at or containing a resonant frequency of the substance, a frequency range centered at or containing a negative value of the resonant frequency of the substance, a frequency range centered at or containing a frequency far from a resonant frequency of water (e.g., pure water), or the like, or any combination thereof. In some embodiments, a frequency range centered at or containing a frequency far from a resonant frequency of water may be indicated by that a characteristic frequency of the frequency range is different from a resonant frequency of water by a threshold frequency. The characteristic frequency of a frequency range may be a frequency within the frequency range, e.g., a medium frequency, an average frequency, a lower bound, an upper bound, etc., of the frequency range. The threshold frequency may be, e.g., 100 ppm, 1,000 ppm, 1,500 ppm, 2,000 ppm, 10,000 ppm, 20,000 ppm, etc. The efficiency of signal acquisition may be improved compared to existing signal acquisition within a continuous frequency range that contains the one or more discrete frequency ranges. In some embodiments, the one or more discrete frequency ranges may exclude a frequency range centered at or containing the resonant frequency of water, reducing a negative influence of the resonance of water within the frequency range centered at or containing the resonant frequency of water on the quality of an image generated based on the plurality of CEST preparations.

In some embodiments, the plurality of CEST preparations may be divided into one or more groups (also referred to as one or more CEST groups). Each CEST group may include multiple CEST preparations with a same offset frequency (or referred to as saturation frequency) among the plurality of offset frequencies. In some embodiments, after the application of a last CEST preparation in each CEST group to the object, the substance may reach a saturation state (e.g., a magnetic saturation state), and the chemical exchange may reach or approach a steady state. In the saturation state, the substance may reach a saturation degree exceeding a saturation threshold; that is, net magnetization of the substance may be smaller than a threshold. For example, the substance may show no net magnetization. In some embodiments, after the application of a CEST preparation other than the last CEST preparation in the CEST group, the substance may progress toward the saturation state in which the saturation degree of the substance may be lower than the saturation threshold.

According to an existing technology, after the application of each of a plurality of CEST preparations, a signal acquisition may start after a substance of interest (or referred to as substance for brevity) has reached the saturation state; however, no signal is acquired during the period between the application of a CEST preparation and the saturation of the substance of interest such that anatomy information within the period may be missing. In contrast, the signal acquisition according to some embodiments of the present disclosure may start before the saturation state establishes, and accordingly achieve a more comprehensive monitoring of the process during which the chemical exchange progresses toward steady state and/or the signal acquisition process may be expedited. For instance, after the application of multiple CEST preparations (e.g., 100, 1,000), the substance may reach the saturation state and signals may be acquired after the application of each of the multiple CEST preparations. The signals so acquired may provide anatomy information over time compared to the existing technology.

In some embodiments, a CEST preparation may include an echo sequence, e.g., a double echo sequence, such that multiple signals (e.g., two first signals, two second signals) of different times to echo (TEs) may be acquired for each echo, and a $B_0$ map may be generated based on the plurality of signals so acquired, for example, using the multitasking technique. An $MTR_{asym}$ relating to the ROI may be corrected based on the $B_0$ map, which is more convenient compared to the determination of $MTR_{asym}$ using a Z-spectrum.

FIG. 1 is a schematic diagram illustrating an exemplary MRI system 100 according to some embodiments of the present disclosure. As illustrated, the MRI system 100 may include an MRI scanner 110, a network 120, a terminal 130, a processing device 140, and a storage device 150. The components of the MRI system 100 may be connected in one or more of various ways. Merely by way of example, as illustrated in FIG. 1, the MRI scanner 110 may be connected to the processing device 140 through the network 120. As another example, the MRI scanner 110 may be connected to the processing device 140 directly (as indicated by the bi-directional arrow in dotted lines linking the MRI scanner 110 and the processing device 140). As a further example, the storage device 150 may be connected to the processing device 140 directly or through the network 120. As still a further example, a terminal device (e.g., 131, 132, 133, etc.) may be connected to the processing device 140 directly (as indicated by the bi-directional arrow in dotted lines linking the terminal 130 and the processing device 140) or through the network 120.

The MRI scanner 110 may scan an object located within its detection region and generate data relating to the object. In the present disclosure, "subject" and "object" are used interchangeably. Merely by way of example, the object may include a patient, a man-made object, etc. As another example, the object may include a specific portion, organ, and/or tissue of a patient. For example, the object may include head, brain, neck, body, shoulder, arm, thorax, cardiac, stomach, blood vessel, soft tissue, knee, feet, or the like, or any combination thereof. In some embodiments, the MRI scanner 110 may be a close-bore scanner or an open-bore scanner.

In the present disclosure, the X-axis, the Y-axis, and the Z-axis shown in FIG. 1 may form an orthogonal coordinate system. The X-axis and the Z-axis shown in FIG. 1 may be horizontal, and the Y-axis may be vertical. As illustrated, the positive X-direction along the X-axis may be from the right side to the left side of the MRI scanner 110 seen from the direction facing the front of the MRI scanner 110; the positive Y-direction along the Y-axis shown in FIG. 1 may be from the lower part to the upper part of the MRI scanner 110; the positive Z-direction along the Z-axis shown in FIG. 1 may refer to a direction in which the object is moved out of the detection region (or referred to as the bore) of the MRI scanner 110. More descriptions of the MRI scanner 110 may be found elsewhere in the present disclosure. See, e.g., FIG. 2 and the description thereof.

In some embodiments, the MRI scanner 110 may include a gantry 112 and a patient support 114 (e.g., along the Z-direction). In some embodiments, the gantry 112 may be configured to support magnets (e.g., the main magnet 201 in FIG. 2), coils (e.g., the gradient coils 202 and/or the radio frequency (RF) coils 203 in FIG. 2), etc. The gantry 112 may surround, along the Z-direction, the object that is moved into or located within the detection region. In some embodiments, the patient support 114 may be configured to support the object. In some embodiments, the patient support 114 may have 6 degrees of freedom, for example, three translational degrees of freedom along three coordinate directions (i.e., X-direction, Y-direction, and Z-direction) and three rotational degrees of freedom around the three coordinate directions. Accordingly, the object may be positioned by the patient support 114 within the detection region. Merely by way of example, the patient support 114 may move the object into the detection region along the Z-direction in FIG. 1.

The network 120 may include any suitable network that can facilitate the exchange of information and/or data for the MRI system 100. In some embodiments, one or more components of the MRI system 100 (e.g., the MRI scanner 110, the terminal 130, the processing device 140, or the storage device 150) may communicate information and/or data with one or more other components of the MRI system 100 via the network 120. For example, the processing device 140 may obtain signals of an RF pulse from the MRI scanner 110 via the network 120. In some embodiments, the network 120 may be any type of wired or wireless network, or a combination thereof.

The terminal 130 may include a mobile device 131, a tablet computer 132, a laptop computer 133, or the like, or any combination thereof. In some embodiments, the mobile device 131 may include a smart home device, a wearable device, a smart mobile device, a virtual reality device, an augmented reality device, or the like, or any combination thereof. In some embodiments, the terminal 130 may remotely operate the MRI scanner 110 and/or the processing device 140. In some embodiments, the terminal 130 may operate the MRI scanner 110 and/or the processing device 140 via a wireless connection. In some embodiments, the terminal 130 may receive information and/or instructions inputted by a user, and send the received information and/or instructions to the MRI scanner 110 or to the processing device 140 via the network 120. In some embodiments, the terminal 130 may receive data and/or information from the processing device 140. In some embodiments, the terminal 130 may be part of the processing device 140. In some embodiments, the terminal 130 may be omitted.

The processing device 140 may process data and/or information obtained from the MRI scanner 110, the terminal 130, and/or the storage device 150. For example, the processing device 140 may obtain a plurality of signals relating to a region of interest (ROI) of an object acquired by applying to the object a plurality of chemical exchange and saturation transfer (CEST) preparations with a plurality of offset frequencies. The processing device 140 may generate an image of the ROI based on the plurality of signals. In some embodiments, the processing device 140 may be a single server or a server group. The server group may be centralized or distributed. In some embodiments, the processing device 140 may be local or remote. In some embodiments, the processing device 140 may be implemented on a cloud platform.

The storage device 150 may store data and/or instructions. In some embodiments, the storage device 150 may store data obtained from the MRI scanner 110, the terminal 130 and/or the processing device 140. For example, the storage device 150 may store a plurality of signals generated by the MRI scanner 110. In some embodiments, the storage device 150 may store data and/or instructions that the processing device 140 may execute or use to perform exemplary methods described in the present disclosure. For example, the storage device 150 may store instructions that the processing device 140 may execute to process a plurality of signals generated by the MRI scanner 110 and encode the plurality of signals for generating an image. In some embodiments, the storage device 150 may include a mass storage device, a removable storage device, a volatile read-and-write memory, a read-only memory (ROM), or the like, or any combination thereof. In some embodiments, the storage device 150 may be implemented on a cloud platform.

In some embodiments, the storage device 150 may be connected to the network 120 to communicate with one or more components of the MRI system 100 (e.g., the MRI scanner 110, the processing device 140, the terminal 130, etc.). One or more components of the MRI system 100 may access the data or instructions stored in the storage device 150 via the network 120. In some embodiments, the storage device 150 may be part of the processing device 140.

In some embodiments, the MRI system 100 may further include one or more power supplies (not shown in FIG. 1) operably connected to one or more components of the MRI system 100 (e.g., the MRI scanner 110, the processing device 140, the terminal 130, the storage device 150, etc.).

Figure 2:
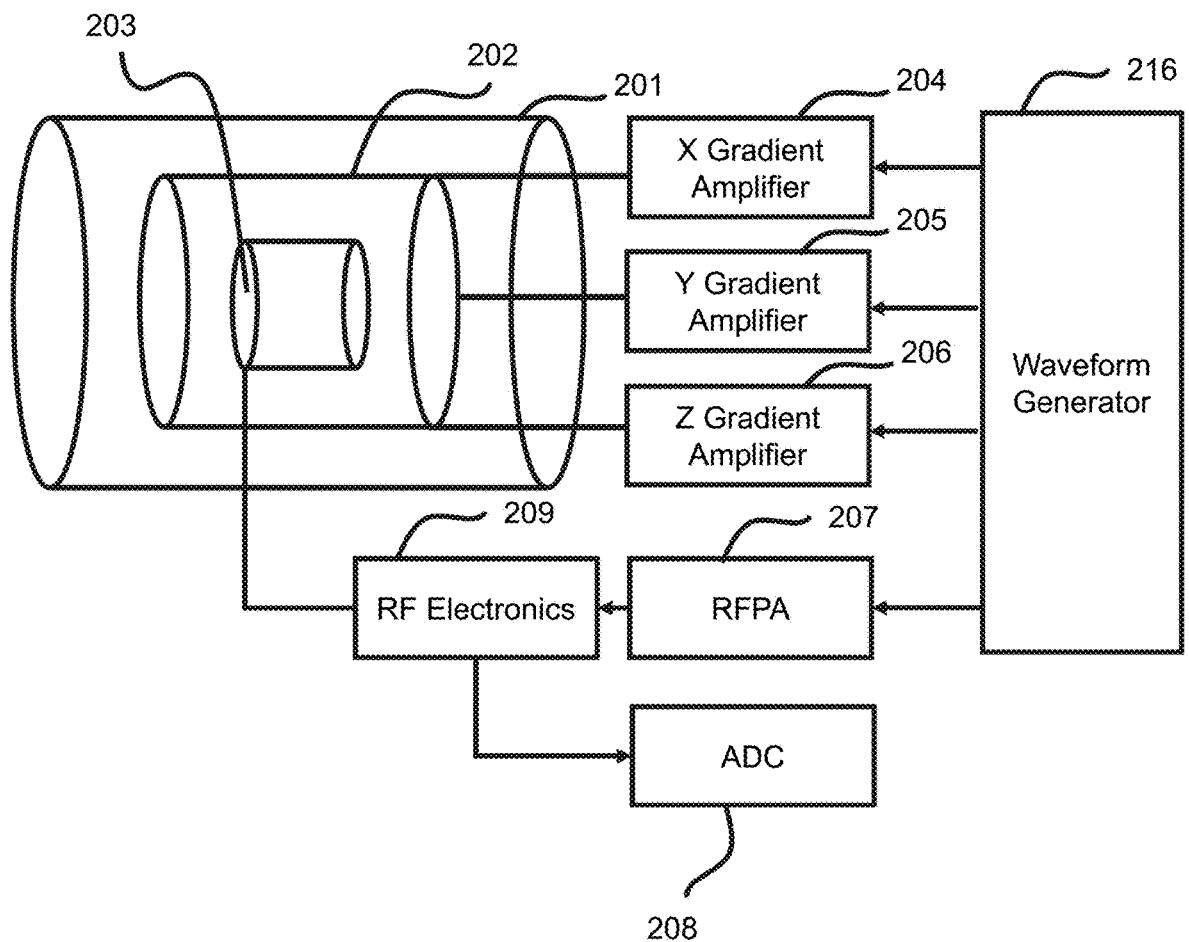
FIG. 2 is a schematic diagram illustrating an exemplary MRI scanner according to some embodiments of the present disclosure.

FIG. 2 is a schematic diagram illustrating an exemplary MRI scanner 110 according to some embodiments of the present disclosure.

As illustrated, the main magnet 201 may generate a first magnetic field (or referred to as a main magnetic field) that may be applied to an object (also referred to as a subject) positioned inside the first magnetic field. The main magnet 201 may include a resistive magnet or a superconductive magnet that both need a power supply (not shown in FIG. 2) for operation. Alternatively, the main magnet 201 may include a permanent magnet. The main magnet 201 may form the detection region and surround, along the Z-direction, the object that is moved into or positioned within the detection region. The main magnet 201 may also control the homogeneity of the generated main magnetic field. Some shim coils may be in the main magnet 201. The shim coils placed in the gap of the main magnet 201 may compensate for the inhomogeneity of the magnetic field of the main magnet 201. The shim coils may be energized by a shim power supply.

Gradient coils 202 may be located inside the main magnet 201. For example, the gradient coils 202 may be located in the detection region. The gradient coils 202 may surround, along the Z-direction, the object that is moved into or positioned within the detection region. The gradient coils 202 may be surrounded by the main magnet 201 around the Z-direction, and be closer to the object than the main magnet 201. The gradient coils 202 may generate a second magnetic field (or referred to as a gradient field, including gradient fields Gx, Gy, and Gz). The second magnetic field may be superimposed on the main magnetic field generated by the main magnet 201 and distort the main magnetic field so that the magnetic orientations of the protons of an object may vary as a function of their positions inside the gradient field, thereby encoding spatial information into MR signals generated by the region of the object being imaged. The gradient coils 202 may include X coils (e.g., configured to generate the gradient field Gx corresponding to the X-direction), Y coils (e.g., configured to generate the gradient field Gy corresponding to the Y-direction), and/or Z coils (e.g., configured to generate the gradient field Gz corresponding to the Z-direction) (not shown in FIG. 2). The three sets of coils may generate three different magnetic fields that are used for position encoding. The gradient coils 202 may allow spatial encoding of MR signals for image reconstruction. The gradient coils 202 may be connected to one or more of an X gradient amplifier 204, a Y gradient amplifier 205, or a Z gradient amplifier 206. One or more of the three amplifiers may be connected to a waveform generator 216. The waveform generator 216 may generate gradient waveforms that are applied to the X gradient amplifier 204, the Y gradient amplifier 205, and/or the Z gradient amplifier 206. An amplifier may amplify a waveform. An amplified waveform may be applied to one of the coils in the gradient coils 202 to generate a magnetic field in the X-axis, the Y-axis, or the Z-axis, respectively. The gradient coils 202 may be designed for either a close-bore MRI scanner or an open-bore MRI scanner. In some instances, all three sets of coils of the gradient coils 202 may be energized and three gradient fields may be generated thereby. In some embodiments, the X coils and Y coils may be energized to generate the gradient fields in the X-direction and the Y-direction. As used herein, the X-axis, the Y-axis, the Z-axis, the X-direction, the Y-direction, and the Z-direction in the description of FIG. 2 are the same as or similar to those described in FIG. 1.

In some embodiments, radio frequency (RF) coils 203 may be located inside the main magnet 201 and serve as transmitters, receivers, or both. For example, the RF coils 203 may be located in the detection region. The RF coils 203 may surround, along the Z-direction, the object that is moved into or positioned within the detection region. The RF coils 203 may be surrounded by the main magnet 201 and/or the gradient coils 202 around the Z-direction, and be closer to the object than the gradient coils 202. The RF coils 203 may be in connection with RF electronics 209 that may be configured or used as one or more integrated circuits (ICs) functioning as a waveform transmitter and/or a waveform receiver. The RF electronics 209 may be connected to a radiofrequency power amplifier (RFPA) 207 and an analog-to-digital converter (ADC) 208.

When used as transmitters, the RF coils 203 may generate RF signals that provide a third magnetic field that is utilized to generate MR signals related to the region of the object being imaged. The third magnetic field may be perpendicular to the main magnetic field. The waveform generator 216 may generate an RF pulse. The RF pulse may be amplified by the RFPA 207, processed by the RF electronics 209, and applied to the RF coils 203 to generate the RF signals in response to a powerful current generated by the RF electronics 209 based on the amplified RF pulse.

When used as receivers, the RF coils may be responsible for detecting MR signals (e.g., echoes). After excitation, the MR signals generated by the object may be sensed by the RF coils 203. The receive amplifier then may receive the sensed MR signals from the RF coils 203, amplify the sensed MR signals, and provide the amplified MR signals to the ADC 208. The ADC 208 may transform the MR signals from analog signals to digital signals. The digital MR signals then may be sent to the processing device 140 for sampling.

In some embodiments, the main magnet 201, the gradient coils 202, and the RF coils 203 may be circumferentially positioned with respect to the object around the Z-direction. It is understood by those skilled in the art that the main magnet 201, the gradient coils 202, and the RF coils 203 may be situated in a variety of configurations around the object.

In some embodiments, the RFPA 207 may amplify an RF pulse (e.g., the power of the RF pulse, the voltage of the RF pulse) such that an amplified RF pulse is generated to drive the RF coils 203. The RFPA 207 may include a transistor-based RFPA, a vacuum tube-based RFPA, or the like, or any combination thereof. The transistor-based RFPA may include one or more transistors. The vacuum tube-based RFPA may include a triode, a tetrode, a klystron, or the like, or any combination thereof. In some embodiments, the RFPA 207 may include a linear RFPA or a nonlinear RFPA. In some embodiments, the RFPA 207 may include one or more RFPAs.

MRI systems (e.g., the MRI system 100 disclosed in the present disclosure) may be commonly used to obtain an interior image from a patient for a particular region of interest (ROI) that can be used for the purposes of, e.g., diagnosis, treatment, or the like, or a combination thereof. MRI systems include a main magnet (e.g., the main magnet 201) assembly for providing a strong uniform main magnetic field to align the individual magnetic moments of the H atoms within the patient's body. During this process, the H atoms oscillate around their magnetic poles at their characteristic Larmor frequency. If the tissue is subjected to an additional magnetic field, which is tuned to the Larmor frequency, the H atoms absorb additional energy, which rotates the net aligned moment of the H atoms. The additional magnetic field may be provided by an RF excitation signal (e.g., the RF signal generated by the RF coils 203).

When the additional magnetic field is removed, the magnetic moments of the H atoms rotate back into alignment with the main magnetic field thereby emitting an echo signal. The echo signal is received and processed to form an MR image. $T_1$ relaxation may be the process by which the net magnetization grows/returns to its initial maximum value parallel to the main magnetic field. $T_1$ may be the time constant for regrowth of longitudinal magnetization (e.g., along the main magnetic field). $T_2$ relaxation may be the process by which the transverse components of magnetization decay or dephase. $T_2$ may be the time constant for decay/dephasing of transverse magnetization.

If the main magnetic field is uniform across the entire body of the patient, then the RF excitation signal may excite all of the H atoms in the sample non-selectively. Accordingly, in order to image a particular portion of the patient's body, magnetic field gradients Gx, Gy, and Gz (e.g., generated by the gradient coils 202) in the x, y, and z directions, having a particular timing, frequency, and phase, may be superimposed on the uniform magnetic field such that the RF excitation signal excites the H atoms in a desired slice of the patient's body, and unique phase and frequency information is encoded in the echo signal depending on the location of the H atoms in the "image slice".

Typically, portions of the patient's body to be imaged are scanned by a sequence of measurement cycles in which the RF excitation signals and the magnetic field gradients Gx, Gy and Gz vary according to an MRI imaging protocol that is being used. A protocol may be designed for one or more tissues to be imaged, diseases, and/or clinical scenarios. A protocol may include a certain number of pulse sequences oriented in different planes and/or with different parameters. The pulse sequences may include spin echo sequences, gradient echo sequences, diffusion sequences, inversion recovery sequences, or the like, or any combination thereof. For instance, the spin echo sequences may include a fast spin echo (FSE) pulse sequence, a turbo spin echo (TSE) pulse sequence, a rapid acquisition with relaxation enhancement (RARE) pulse sequence, a half-Fourier acquisition single-shot turbo spin-echo (HASTE) pulse sequence, a turbo gradient spin echo (TGSE) pulse sequence, or the like, or any combination thereof. As another example, the gradient echo sequences may include a balanced steady-state free precession (bSSFP) pulse sequence, a spoiled gradient echo (GRE) pulse sequence, and an echo planar imaging (EPI) pulse sequence, a steady state free precession (SSFP), or the like, or any combination thereof. The protocol may also include information regarding image contrast and/or ratio, an ROI, slice thickness, an imaging type (e.g., $T_1$ weighted imaging, $T_2$ weighted imaging, proton density weighted imaging, etc.), $T_1$, $T_2$, an echo type (spin echo, fast spin echo (FSE), fast recovery FSE, single shot FSE, gradient recalled echo, fast imaging with stead-state procession, and so on), a flip angle value, acquisition time (TA), echo time (TE), repetition time (TR), echo train length (ETL), the number of phases, the number of excitations (NEX), inversion time, bandwidth (e.g., RF receiver bandwidth, RF transmitter bandwidth, etc.), or the like, or any combination thereof. For each MRI scan, the resulting echo signals may be digitized and processed to reconstruct an image in accordance with the MRI imaging protocol that is used.

Figure 3:
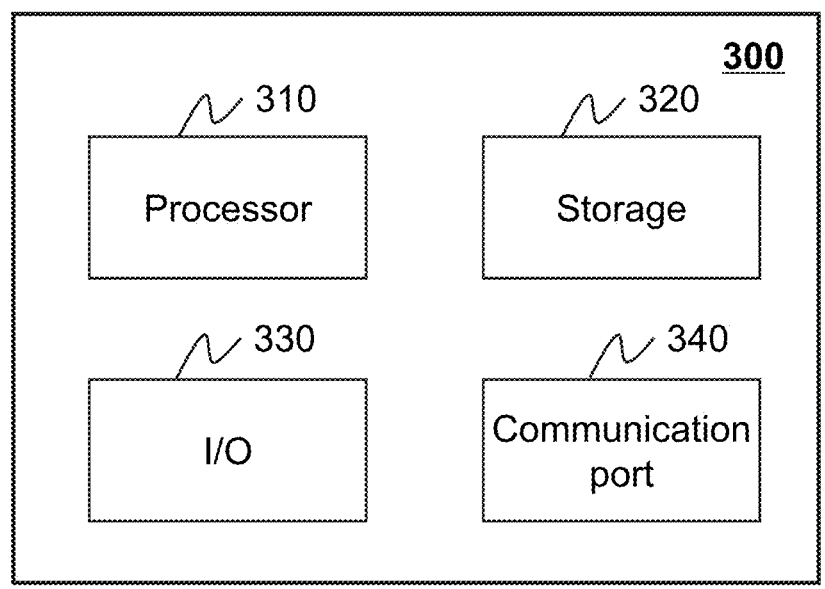
FIG. 3 is a schematic diagram illustrating hardware and/or software components of an exemplary computing device according to some embodiments of the present disclosure.

FIG. 3 is a schematic diagram illustrating exemplary hardware and/or software components of a computing device 300 on which the processing device 140 may be implemented according to some embodiments of the present disclosure. As illustrated in FIG. 3, the computing device 300 may include a processor 310, a storage 320, an input/output (I/O) 330, and a communication port 340.

The processor 310 may execute computer instructions (program code) and perform functions of the processing device 140 in accordance with techniques described herein. For example, the processor 310 may obtain a plurality of MR signals relating to a region of interest (ROI) of an object from the storage device 150 and/or a terminal 130. In some embodiments, the processor 310 may include a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration purposes, only one processor is described in the computing device 300. However, it should be noted that the computing device 300 in the present disclosure may also include multiple processors, and thus operations of a method that are performed by one processor as described in the present disclosure may also be jointly or separately performed by the multiple processors. For example, if in the present disclosure the processor of the computing device 300 executes both operations A and B, it should be understood that operations A and step B may also be performed by two different processors jointly or separately in the computing device 300 (e.g., a first processor executes operation A and a second processor executes operation B, or the first and second processors jointly execute operations A and B).

The storage 320 may store data/information obtained from the MRI scanner 110, the terminal 130, the storage device 150, or any other component of the MRI system 100. In some embodiments, the storage 320 may include a mass storage device, a removable storage device, a volatile read-and-write memory, a read-only memory (ROM), or the like, or any combination thereof. In some embodiments, the storage 320 may store one or more programs and/or instructions to perform exemplary methods described in the present disclosure. For example, the storage 320 may store a program for the processing device 140 for generating an image of an ROI based on a plurality of MR signals.

The I/O 330 may input or output signals, data, or information. In some embodiments, the I/O 330 may enable user interaction with the processing device 140. In some embodiments, the I/O 330 may include an input device and an output device. Exemplary input devices may include a keyboard, a mouse, a touch screen, a microphone, a trackball, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

The communication port 340 may be connected to a network (e.g., the network 120) to facilitate data communications. The communication port 340 may establish connections between the processing device 140 and the MRI scanner 110, the terminal 130, or the storage device 150. The connection may be a wired connection, a wireless connection, or a combination of both that enables data transmission and reception. In some embodiments, the communication port 340 may be a standardized communication port, such as RS232, RS485, etc. In some embodiments, the communication port 340 may be a specially designed communication port. For example, the communication port 340 may be designed in accordance with the digital imaging and communications in medicine (DICOM) protocol.

Figure 4:
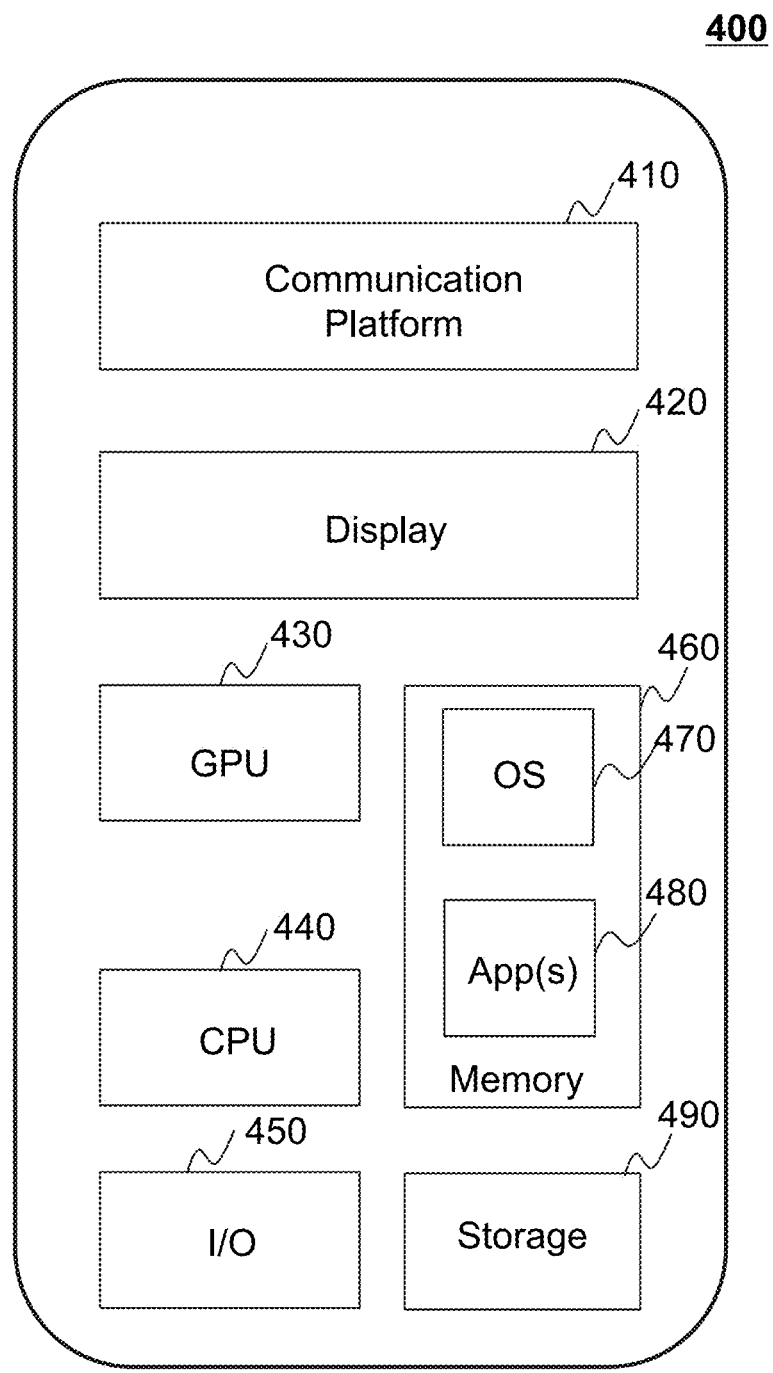
FIG. 4 is a schematic diagram illustrating hardware and/or software components of an exemplary mobile device according to some embodiments of the present disclosure.

FIG. 4 is a schematic diagram illustrating exemplary hardware and/or software components of a mobile device on which the terminal 130 may be implemented according to some embodiments of the present disclosure. As illustrated in FIG. 4, the mobile device 400 may include a communication platform 410, a display 420, a graphic processing unit (GPU) 430, a central processing unit (CPU) 440, an I/O 450, a memory 460, and a storage 490. In some embodiments, any other suitable component, including but not limited to a system bus or a controller (not shown), may also be included in the mobile device 400. In some embodiments, a mobile operating system 470 (e.g., iOS, Android, Windows Phone, etc.) and one or more applications 480 may be loaded into the memory 460 from the storage 490 in order to be executed by the CPU 440. The applications 480 may include a browser or any other suitable mobile apps for receiving and rendering information relating to image processing or other information from the processing device 140. User interactions with the information stream may be achieved via the I/O 450 and provided to the processing device 140 and/or other components of the MRI system 100 via the network 120.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to the blood pressure monitoring as described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result the drawings should be self-explanatory.

Figure 5:
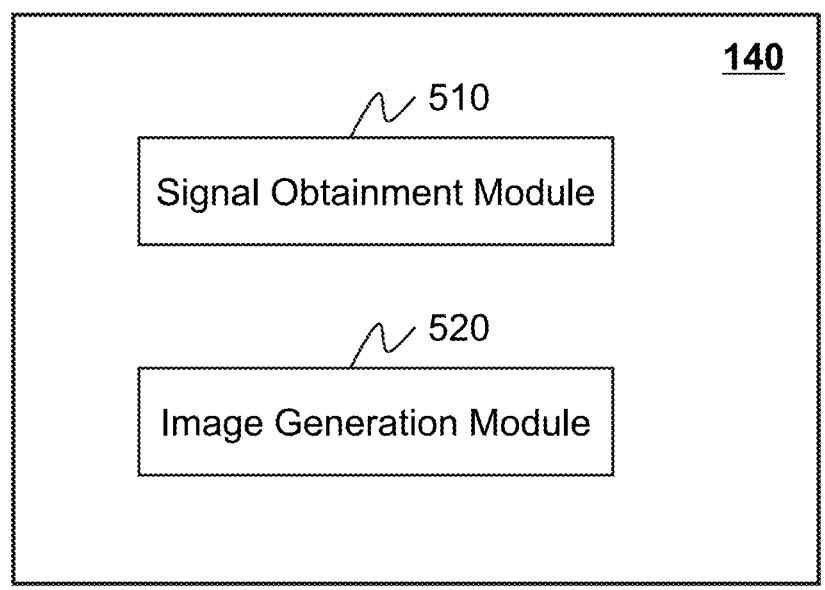
FIG. 5 is a block diagram illustrating an exemplary processing device according to some embodiments of the present disclosure.

FIG. 5 is a schematic block diagram illustrating an exemplary processing device 140 according to some embodiments of the present disclosure. The processing device 140 may include a signal obtainment module 510 and an image generation module 520.

The signal obtainment module 510 may be configured to obtain a plurality of signals relating to a region of interest (ROI) of an object acquired by applying to the object a plurality of CEST preparations with a plurality of offset frequencies. More descriptions of the determination of the plurality of signals may be found elsewhere in the present disclosure (e.g., FIGS. 6-9 and descriptions thereof).

The image generation module 520 may be configured to generate an image (also referred to as a CEST image) of the ROI based on at least a portion of the plurality of signals. More descriptions of the generation of the image may be found elsewhere in the present disclosure (e.g., FIGS. 6-9 and descriptions thereof).

The modules in the processing device 140 may be connected to or communicate with each other via a wired connection or a wireless connection. The wired connection may include a metal cable, an optical cable, a hybrid cable, or the like, or any combination thereof. The wireless connection may include a Local Area Network (LAN), a Wide Area Network (WAN), a Bluetooth, a ZigBee, a Near Field Communication (NFC), or the like, or any combination thereof. Two or more of the modules may be combined as a single module, and any one of the modules may be divided into two or more units.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the processing device 140 may further include a storage module (not shown in FIG. 5). The storage module may be configured to store data generated during any process performed by any component of in the processing device 140. As another example, each of the components of the processing device 140 may include a storage device. Additionally or alternatively, the components of the processing device 140 may share a common storage device.

FIG. 6 is a flowchart illustrating an exemplary imaging process of an imaging system according to some embodiments of the present disclosure. In some embodiments, process 600 may be executed by the MRI system 100. For example, the process 600 may be implemented as a set of instructions (e.g., an application) stored in a storage device (e.g., the storage device 150, the storage 320, and/or the storage 490). In some embodiments, the processing device 140 (e.g., the processor 310 of the computing device 300, the CPU 440 of the mobile device 400, and/or one or more modules illustrated in FIG. 5) may execute the set of instructions and may accordingly be directed to perform the process 600.

In 610, the processing device 140 (e.g., the signal obtainment module 510) may obtain a plurality of signals relating to a region of interest (ROI) of an object acquired by applying to the object a plurality of CEST preparations with a plurality of offset frequencies. For example, the ROI of the object may include the heart, the head, a lung, a lumbar disc, a nerve, articular cartilage, an intervertebral disc, a shoulder, or the like, or any combination thereof.

In some embodiments, the plurality of CEST preparations may be configured to excite a chemical exchange (e.g., photon exchange, molecular exchange) of a substance in the ROI. After each of the plurality of CEST preparations is applied, exchangeable photons or molecules of the substance may be excited and react with photons (e.g., non-excited photons) of water (e.g., pure water). In some embodiments, the substance may include an endogenous substance or an exogenous substance. The endogenous substance may refer to a substance intrinsic in the object. For example, the endogenous substance may include creatine in the heart, acylamino in the head, glutamic acid (Glu) in a nerve, glycosaminoglycan (GAG) in cartilage (e.g., an intervertebral disc), or the like, or any combination thereof. The exogenous substance may refer to a substance administered to the object. For example, the exogenous substance may include a paramagnetic substance, a diamagnetic substance, etc. As another example, the exogenous substance may include a substance containing an amide group, a substance containing an amino group, a substance containing a hydroxide group, or the like, or any combination thereof.

In some embodiments, a CEST preparation may include a radiofrequency pulse sequence of a particular offset frequency that is capable of exciting the chemical exchange between the substance and water. As used herein, an offset frequency may refer to a deviation from a resonant frequency of water (e.g., 0 parts per million (ppm)). For example, the radiofrequency pulse sequence may include a spoiled gradient-recalled (GRE) sequence (e.g., a multiple echo data image combination (MEDIC) sequence), a fast GRE sequence, a gradient recalled acquisition in steady state (GRASS) sequence, a steady-state free precession (SSFP) sequence (e.g., a balance SSFP sequence), a double echo steady state (DESS) sequence, a magnetization-prepared gradient-recalled (MP-GRE) sequence (e.g., a MP-fast GRE sequence), a multi-echo sequence (e.g., a double echo sequence), or the like, or any combination thereof. As another example, the radiofrequency pulse sequence may include a Gaussian pulse sequence, a square-wave pulse sequence, etc.

In some embodiments, the plurality of offset frequencies may be within one or more discrete frequencies ranges. The processing device 140 may select multiple reference offset frequencies based on at least one of a resonant frequency of the substance or a resonant frequency of water (e.g., 0 ppm). For example, the multiple reference offset frequencies may include at least one of the resonant frequency of the substance, a negative value of the resonant frequency of the substance, or an offset frequency far from the resonate frequency of water. "Far from" used herein may indicate that a difference between two frequencies exceeds a frequency threshold (e.g., 1,000 ppm, 1,500 ppm, 2,000 ppm, 10,000 ppm, 20,000 ppm).

In some embodiments, the processing device 140 may determine the one or more discrete frequency ranges based on the multiple reference offset frequencies. For example, the one or more discrete frequency ranges may include a frequency range centered at or containing the resonant frequency of the substance, a frequency range centered at or containing the negative value of the resonant frequency of the substance, a frequency range centered at or containing the offset frequency far from the resonant frequency of water, or the like, or any combination thereof. In some embodiments, the one or more discrete frequency ranges may exclude a frequency range centered at or containing the resonant frequency of water.

In some embodiments, a breadth of a discrete offset frequency range may relate to, e.g., the inhomogeneity of a main magnetic field ($B_0$ field) of the imaging system. The processing device 140 may determine the breadth of the discrete offset frequency range based on the inhomogeneity of the $B_0$ field. In some embodiments, the processing device 140 may determine the breadth of the discrete offset frequency range based on a deviation of a preset offset frequency (e.g., 0 ppm). A ratio of the breadth of the discrete offset frequency range to the deviation of the preset offset frequency may be equal to or larger than a ratio threshold. For example, the ratio threshold may include 1, 1.5, 2, 3, etc. In some embodiments, the breadth of a discrete offset frequency range may be set according to a default setting of an imaging system (e.g., the MRI system 100) or provided by a user. For example, the breadth of a discrete offset frequency range may include 0.5 ppm, 1 ppm, 2 ppm, etc. As another example, assuming that the substance of the ROI includes creatine in the heart whose resonant frequency is 2 ppm, the one or more discrete offset frequency ranges may include at least one of −3 ppm~−1 ppm centered at the negative value of the resonant frequency of creatine, 1 ppm~3 ppm centered at the resonant frequency of creatine, or 2000 ppm~2002 ppm that is far away from the resonant frequency of water.

In some embodiments, for each of the one or more discrete offset frequency ranges, multiple offset frequencies within the discrete offset frequency range may be included in the plurality of offset frequencies of the CEST preparations. For example, pairs of consecutive offset frequencies of the multiple offset frequencies may have a constant interval. As another example, the plurality of offset frequencies may include the resonant frequency of the substance, the negative value of the resonant frequency of the substance, an offset frequency far from the resonant frequency of water, offset frequencies that are centered at or contain the resonant frequency of the substance, offset frequencies that are centered at or contain the negative value of the resonant frequency of the substance, offset frequencies that are centered at or contains the offset frequency far from the resonant frequency of water, etc.

In some embodiments, the plurality of CEST preparations may be divided into one or more groups (also referred to as one or more CEST groups). Each CEST group may include multiple CEST preparations with a same offset frequency among the plurality of offset frequencies. In some embodiments, after a last CEST preparation in each of the one or more CEST groups is applied to the object, the substance may reach a saturation state (e.g., a magnetic saturation state), and the chemical exchange may reach a steady state. In the saturation state, the substance may reach a saturation degree exceeding a saturation threshold; that is, net magnetization of the substance may be smaller than a threshold. For example, the substance may show no net magnetization. In some embodiments, a count of multiple CEST preparations in each CEST group may be 100, 1000, or more.

In some embodiments, the plurality of offset frequencies may include a resonant frequency of the substance, a negative value of the resonant frequency of the substance, an offset frequency far from the resonate frequency of water (e.g., 0 ppm), etc. The plurality of offset frequencies may exclude the resonate frequency of water. "Far from" used herein may indicate that a difference between two frequencies exceeds a frequency threshold (e.g., 1,000 ppm, 1,500 ppm, 2,000 ppm, 10,000 ppm, 20,000 ppm).

In some embodiments, after a CEST preparation other than the last CEST preparation in the CEST group is applied, the substance may reach a sub-saturation state. In the sub-saturation state, the substance may reach a saturation degree lower than the saturation threshold. Taking two CEST preparations other than the last CEST preparation in the CEST group as an example, the saturation degree of the substance after a first CEST preparation of the two CEST preparations is applied to the object may be lower than the saturation degree of the substance after a second CEST preparation of the two CEST preparations is applied subsequent to the first CEST preparation.

In some embodiments, as different CEST preparations in the CEST group are applied, the chemical exchange may progress toward a steady state. Taking two CEST preparations other than the last CEST preparation in the CEST group as an example, after a second CEST preparation of the two CEST preparations is applied to the object subsequent to the application of a first CEST preparation, the chemical exchange between the substance and water may be closer to the steady state than after the application of the first CEST preparation of the two CEST preparations. In some embodiments, after the application of multiple CEST preparations in one of the one or more CEST groups, multiple CEST preparations in another of the one or more CEST groups may be applied. Therefore, the chemical exchange may be accumulative and reach a steady state for each of the plurality of offset frequencies.

In some embodiments, a duration of each of the plurality of CEST preparations may relate to one or more factors including, for example, a saturation degree of the CEST preparation, a type of the substance, an offset frequency of the CEST preparation, a phycological motion of the object, etc. In some embodiments, the processing device 140 may determine the duration of the CEST preparation based on at least one of the one or more exemplary factors. In some embodiments, the duration of the CEST preparation may be set according to a default setting of the imaging system or provided by a user. For example, the duration of the CEST preparation may be 0.1 seconds, 0.3 seconds, 1 second, etc.

In some embodiments, the duration of a CEST preparation may be smaller than a time threshold. In some embodiments, the time threshold may include a duration for applying only one CEST preparation to reach the saturation state. In some embodiments, the duration may be lower than a characteristic time of a physiological motion of the ROI. In some embodiments, the characteristic time of a physiological motion of a portion of an object (e.g., an ROI of the object) may refer to a duration of a motion cycle of the ROI. For example, the motion cycle may include a cardiac cycle, a respiratory cycle, etc.

In some embodiments, a time interval between two consecutive CEST preparations may be smaller than a second time threshold. For example, the second time threshold may be lower than the characteristic time of the physiological motion of the ROI. In some embodiments, the time interval between two consecutive CEST preparations may be set according to a default setting of the imaging system or provided by a user. For example, the time interval may be 10 milliseconds, 100 milliseconds, etc.

Figure 7:
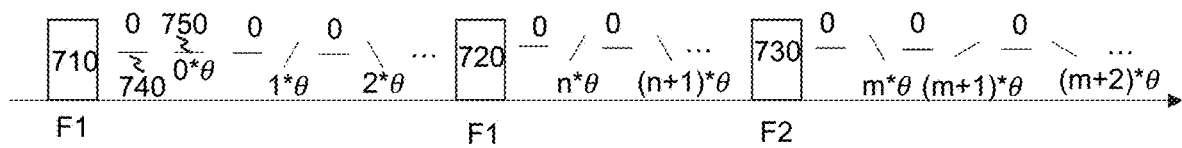
FIG. 7 is a schematic diagram illustrating an exemplary signal acquisition process according some embodiments of the present disclosure.

In some embodiments, after a CEST preparation is applied, signal acquisition may be performed for multiple times before a next CEST preparation is applied. In some embodiments, signal acquisition after the application of a CEST preparation may be based on a multitasking technique. After the application of each of at least one of the plurality of CEST preparations to the object, multiple signal pairs of the plurality of signals may be acquired. Each signal pair of the multiple signal pairs may include at least one first signal and at least one second signal. The at least one first signal and at least one second signal may be alternatively acquired. For example, as shown in FIG. 7, CEST preparations 710, 720, and 730 may be represented by three open columns, respectively. Solid lines and dotted lines between the CEST preparation 710 and the CEST preparation 720 may represent multiple signal pairs acquired after the application of the CEST preparation 710. A solid line and a dotted line immediately following the solid line may represent one signal pair. The solid line in a signal pair may represent at least one first signal, while the dotted line immediately following the solid line may represent at least one second signal in the signal pair.

In some embodiments, the at least one first signal (also referred to as navigation signal) may be used to estimate temporal information of the ROI of the object during the acquisition of the plurality of signals. In some embodiments, the temporal information may be used to assess a motion of the ROI during the acquisition of the plurality of signals. The at least one first signal may correspond to motion data (e.g., cardiac motion data, respiratory motion data) for generating the image of the ROI. In some embodiments, the at least one first signal may correspond to data relating to at least one time-varying dimension (also referred to as at least one temporal dimension) of the ROI of the object. In some embodiments, the data relating to the at least one time-varying dimension may be of high-temporal resolution. Exemplary time-varying dimensions may relate to a cardiac motion, a respiratory motion, a $T_1$ relaxation, a $T_2$ relaxation, a CEST dimension, a contrast agent dynamic, a $T_{1\rho}$ contrast, a molecular diffusion, an elapsed time, or the like, or any combination thereof.

In some embodiments, the at least one second signal may correspond to image data for generating the image of the ROI. In some embodiments, the at least one second signal may include image data relating to at least one spatial-varying dimension (also referred to as at least one spatial dimension) of the ROI of the object. In some embodiments, the image data may be of high-spatial resolution. Exemplary spatial-varying dimensions may relate to a slice selection direction, a phase encoding direction, a frequency encoding direction, or the like, or any combination thereof.

In some embodiments, the multiple pairs of the at least one first signal and the at least one second signal may be used to generate the image based on, e.g., a low-rank tensor (LRT) imaging model. In some embodiments, the image of the ROI may be a product of a core tensor and factor matrixes. The factor matrixes may include at least one temporal factor matrix and at least one spatial factor matrix (e.g., one spatial factor matrix). Each of the at least one temporal factor matrix may relate to one of the at least one time-varying dimension. Each of the at least one spatial factor matrix may relate to one of the at least one spatial-varying dimension. The core tensor may be used to govern the interaction between the factor matrixes. The at least one first signal may be used to estimate the core tensor and the at least one temporal factor matrix. The at least one spatial factor matrix may be determined by fitting the core tensor and the temporal factor matrices to data acquired based on the at least one second signal.

Figure 8:
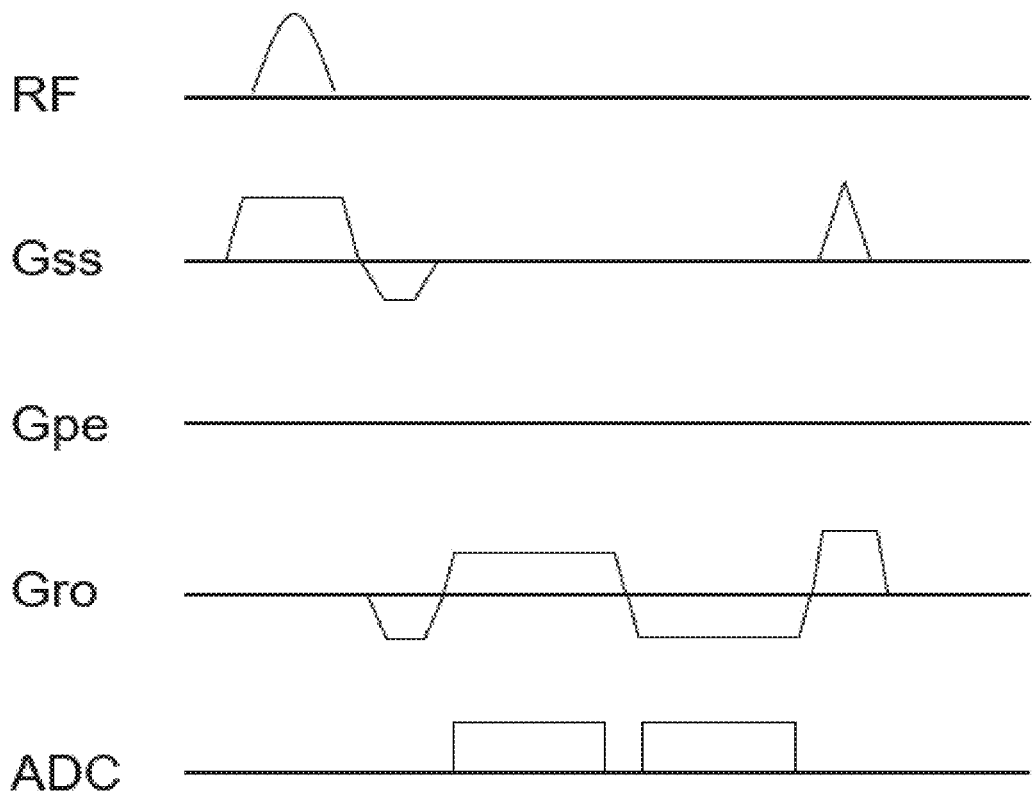
FIG. 8 is a schematic diagram illustrating an exemplary double echo sequence according to some embodiments of the present disclosure.

In some embodiments, each of at least one of the plurality of CEST preparations may include a double echo sequence. FIG. 8 is a schematic diagram illustrating an exemplary double echo sequence 800 according to some embodiments of the present disclosure. Each of the at least one of the multiple signal pairs may include two first signals (e.g., two rectangle peaks in the waveform acquired by an analog-to-digital converter (ADC) as illustrated in FIG. 8) and two second signals (e.g., two rectangle peaks in the waveform acquired by an ADC as illustrated in FIG. 8) acquired in response to the double echo sequence. The two first signals may be acquired at different times to echo (TEs), and the two second signals may be acquired at different TEs.

In some embodiments, the plurality of signals may be acquired using a sampling technique. For example, the sampling technique may include a radial sampling technique, a spiral sampling technique, a Cartesian sampling technique, a zig-zag sampling technique, an oscillation sampling technique, etc. As another example, the sampling technique may include a golden angle (e.g., 111.25°) sampling technique. As a further example, the sampling technique may include a fully sampling technique, an undersampling technique, an oversampling technique, etc.

In some embodiments, the processing device 140 may obtain the plurality of signals from one or more components (e.g., the MRI scanner 110, the terminal 130, and/or the storage device 150) of the MRI system 100 or an external storage device via the network 120. For example, the MRI scanner 110 may acquire the plurality of signals and transmit the plurality of signals to the storage device 150, or any other storage device for storage. The processing device 140 may obtain the plurality of signals from the storage device 150, or any other storage device. As another example, the processing device 140 may obtain the plurality of signals from the MRI scanner 110 directly.

In 620, the processing device 140 (e.g., the image generation module 520) may generate an image (also referred to as a CEST image) of the ROI based on at least a portion of the plurality of signals. In some embodiments, the processing device 140 may generate the image of the ROI based on all of the plurality of signals. In some embodiments, the processing device 140 may generate the image of the ROI based on a portion of the plurality of signals acquired after the application of a last CEST preparation of each of at least one of the one or more CEST groups. In some embodiments, the processing device 140 may generate the image based on the at least a portion of the plurality of signals using the multitasking technique. The processing device 140 may transform the at least a portion of the plurality of signals to a tensor (e.g., a multidimensional tensor). The processing device 140 may generate the image by resolving the tensor. In some embodiments, the processing device 140 may resolve the tensor using a low-rank tensor (LRT) imaging model.

In some embodiments, the tensor may include a first component representing an echo dimension of each CEST preparation, a second component representing a spatial dimension (e.g., a pixel matrix, a voxel dimension) of the image, a third component representing a count of the plurality of offset frequencies, a fourth component representing a count of multiple CEST preparations in each of the one or more CEST groups, a fifth component representing a count (e.g., 15, 18, 20, 30) of cardiac phases of a cardiac cycle of the object, a sixth component representing a count (e.g., 3, 4, 6) of respiratory phases of a respiratory cycle of the object, or the like, or any combination thereof. For example, if the ROI involves a cardiac motion, the tensor may include the fifth component. As another example, if the ROI involves a respiratory motion, the tensor may include the sixth component. In some embodiments, a CEST preparation may include a double echo sequence. An echo dimension of the CEST preparation may correspond to two first signals or two second signals acquired in response to the application of the CEST preparation.

In some embodiments, the image of the ROI may include at least one of a static image or a dynamic image of the ROI. In some embodiments, a static image may correspond to a specific motion phase (e.g., a cardiac phase, a respiratory phase of the ROI. In some embodiments, a dynamic image may reflect dynamic information of the ROI along a time-varying dimension. The dynamic image may include a series of images corresponding to a plurality of motion phases of the object, or a portion thereof (e.g., the ROI). For example, the dynamic image may provide information of the cardiac motion over a cardiac cycle. The dynamic image may include a plurality of images corresponding to a plurality of cardiac phases in the cardiac cycle.

In some embodiments, the processing device 140 may generate a $B_0$ map based on the tensor. The $B_0$ map may be used to represent a field strength of a magnetic field ($B_0$) generated by a main magnetic field of the imaging system. In some embodiments, the processing device 140 may determine a first phase difference between the at least one first signal and a second phase difference between the at least one second signal of each of at least one of the multiple signal pairs acquired after the application of a CEST preparation. The processing device 140 may generate the $B_0$ map based on the first phase differences, the second phase differences, the second component, the third component, and the fourth component. In some embodiments, a CEST preparation may include a double echo sequence. The first phase difference may be between two first signals, and the second phase difference may be between two second signals.

In some embodiments, the processing device 140 may also generate an averaging result by averaging reference $B_0$ maps that are determined, after the first phase difference and the second phase difference are determined, based on values of the fifth component and reference $B_0$ maps that are determined, after the first phase difference and the second phase difference are determined, based on values of the sixth component. The processing device 140 may generate the $B_0$ map based on the first phase differences, the second phase differences, the second component, the third component, the fourth component, and the averaging result. In some embodiments, the processing device 140 may determine the $B_0$ map according to Equation (1) below:

$$B_0(U) = \text{angle}(\mathcal{A}(E_1, U, Q, D, C, R) * \text{conj}(\mathcal{A}(E_2, U, Q, D, C, R)))/\Delta TE/B/\gamma/(2\pi), \quad (1)$$

where $B_0(U)$ refers to the $B_0$ map, U refers to the second component of the tensor, $E_1$ refers to one of the two first signals or one of the two second signals acquired based on a double-echo sequence, and $E_2$ refers to another of the two first signals or another of the two second signals acquired based on the double-echo sequence, Q refers to the third component of the tensor, D refers to the fourth component of the tensor, C refers to the fifth component of the tensor, R refers to the sixth component of the tensor, $\Delta TE$ refers to a difference between two TEs corresponding to the double echo sequence, B refers to a strength of a main magnetic field ($B_0$ field), and $\gamma$ refers to a magnetogyric ratio of the main magnetic field.

In some embodiments, a magnetization transfer ratio asymmetry ($MTR_{asym}$) relating to the ROI may be determined based on signals acquired at the multiple reference offset frequencies as illustrated in operation 610. However, a main magnetic field ($B_0$ field) may be inhomogeneous due to one or more factors including, for example, a configuration of a main magnet, the susceptibility of the ROI to a magnetic field (e.g., the $B_0$ field), etc. The inhomogeneity of the $B_0$ field may cause a deviation between an ideal offset frequency and an actual offset frequency. In some embodiments, the processing device 140 may correct the $MTR_{asym}$ based on the $B_0$ map.

In some embodiments, the processing device 140 may determine a deviation value with respect to each of the multiple reference offset frequencies based on the $B_0$ map. For example, the multiple reference offset frequencies may include the resonant frequency of the substance, the negative value of the resonant frequency of the substance, an offset frequency far from the resonant frequency of water, etc. The processing device 140 may determine a target offset frequency corresponding to a reference offset frequency based on the corresponding reference offset frequency and a deviation value of the corresponding reference offset frequency. In some embodiments, the target offset frequency may be equal to a sum of the corresponding reference offset frequency and the deviation value thereof. In some embodiments, the multiple deviation values may be the same. In some embodiments, the processing device 140 may determine a deviation of a preset offset frequency (e.g., 0 ppm)

based on the $B_0$ map. A deviation value of a reference offset frequency may be equal to the deviation of the preset offset frequency.

In some embodiments, the processing device 140 may correct the $MTR_{asym}$ based on the multiple target offset frequencies and multiple signals corresponding to the multiple target offset frequencies among the plurality of signals. In some embodiments, each of the multiple signals corresponding to one of the multiple target offset frequencies may include a signal (e.g., a first signal, a second signal) acquired after the application to the object the last CEST preparation of a CEST group with the target offset frequency. In some embodiments, the processing device 140 may correct the $MTR_{asym}$ based on the $B_0$ map according to Equation (2) or Equation (3) below:

$$MTR_{asym}(U,C,R) = (\mathcal{A}(E_1,U,q_1,last_1,C,R) - \mathcal{A}(E_1,U,q_2,last_2,C,R))/\mathcal{A}(E_1,U,q_3,last_3,C,R), \quad (2)$$

$$MTR_{asym}(U,C,R) = (\mathcal{A}(E_2,U,q_1,last_1,C,R) - \mathcal{A}(E_2,U,q_2,last_2,C,R))/\mathcal{A}(E_2,U,q_3,last_3,C,R), \quad (3)$$

where $MTR_{asym}(U, C, R)$ refers to the $MTR_{asym}$, U refers to the second component of the tensor, C refers to the fifth component of the tensor, R refers to sixth component of the tensor, $E_1$ refers to one of the two first signals or one of the two second signals acquired based on a double-echo sequence, $E_2$ refers to another first signal of the two first signals or another second signal of the two second signals acquired based on the double-echo sequence, $q_1$ refers to a first target offset frequency corresponding to the negative value of the resonate frequency of the substance, $last_1$ refers to a signal acquired after the application to the object a last CEST preparation of a CEST group with the first target offset frequency, $q_2$ refers to a second target offset frequency corresponding to the resonate frequency of the substance, $last_2$ refers to a signal acquired after the application to the object a last CEST preparation of a CEST group with the second target offset frequency, $q_3$ refers to a third target offset frequency corresponding to the frequency far from the resonate frequency of water, and $last_3$ refers to a signal acquired after the application to the object a last CEST preparation of a CEST group with the third target offset frequency.

In some embodiments, the processing device 140 may generate the image based on the corrected $MTR_{asym}$. For example, the image may include an amide CEST image (e.g., an amide proton transfer (APT) image, an APT weighted image), a hydroxyl CEST image, an amine CEST image, or the like, or any combination thereof.

FIG. 7 is a schematic diagram illustrating an exemplary signal acquisition process 700 according to some embodiments of the present disclosure.

As described elsewhere in the present disclosure, a plurality of signals (e.g., MR signals) relating to an ROI of an object may be acquired by applying to the object a plurality of CEST preparations with a plurality of offset frequencies. As shown in FIG. 7, the plurality of CEST preparations may include a CEST preparation 710, a CEST preparation 720, and a CEST preparation 730 that are represented by open columns, respectively. The CEST preparations 710 and 720 may have a first offset frequency indicated by F1 in FIG. 7. The CEST preparation 730 may have a second offset frequency indicated by F2 in FIG. 7. In some embodiments, the second offset frequency may be different from the first offset frequency.

As described elsewhere in the present disclosure, after the application of each of the plurality of CEST preparations to the object, multiple signal pairs of the plurality of signals may be acquired. One of the multiple signal pairs may include at least one first signal and at least one second signal. As shown in FIG. 7, a solid line (e.g., line 740) may represent at least one first signal and a dotted line (e.g., line 750) immediately following the solid line (e.g., line 740) may represent at least one second signal in a signal pair. First trajectories corresponding to first signals among the plurality of signals may maintain at a same angle, e.g., 0° in FIG. 7. Second trajectories corresponding to second signals among the plurality of signals be spaced by a preset azimuthal increment, e.g., θ shown in FIG. 7, e.g., 111.25°.

Figure 9:
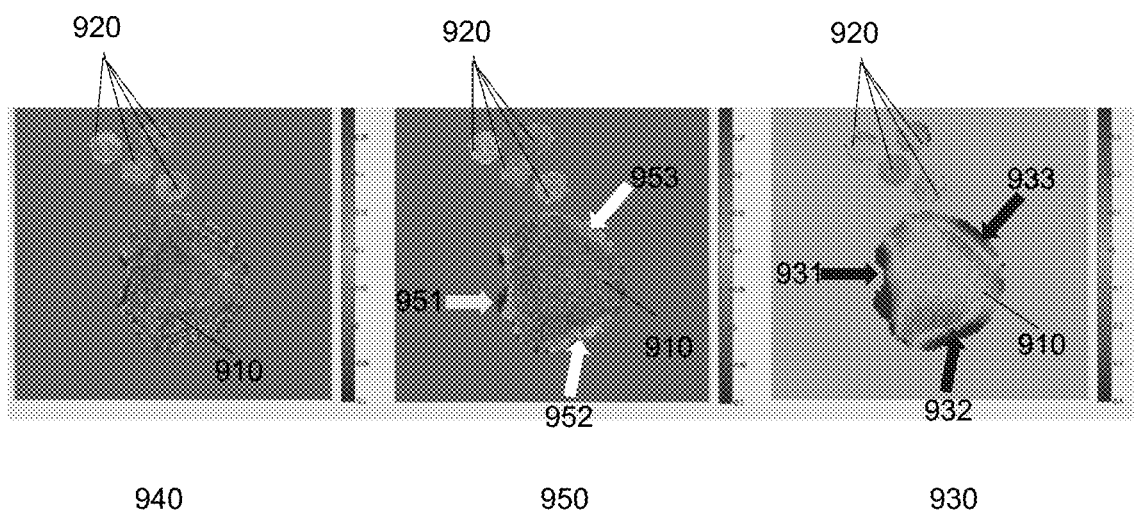
FIG. 9 provides CEST images of exemplary water phantoms with and without a correction of inhomogeneity in the $B_0$ field, respectively, and a corresponding $B_0$ map according to some embodiments of the present disclosure.

FIG. 9 provides CEST images of exemplary water phantoms with and without a correction of inhomogeneity in the $B_0$ field, respectively, and a corresponding $B_0$ map according to some embodiments of the present disclosure.

In some embodiments, different water phantoms may be provided. A water phantom 910 may include pure water, and four water phantoms 920 may include different concentrations of creatine. The different water phantoms may be imaged based on an imaging process as illustrated below. FIG. 9 provides an imaging result (e.g., an CEST image) of the different water phantoms.

As shown in FIG. 9, an image 930 may represent a $B_0$ map. An image 940 may be generated based on an $MTR_{asym}$ corrected with respect to inhomogeneity in the $B_0$ field. The correction may be performed using the $B_0$ map. An image 950 may be generated based on an $MTR_{asym}$ without the correction of inhomogeneity in the $B_0$ field. Digits on an axis of FIG. 9 may represent the intensity of a CEST effect. Digit "0" may refer that there may be no CEST effect. Since the water phantom 910 includes pure water, an ideal imaging result of the water phantom 910 may show no CEST effect. Since the four water phantoms 920 include different concentrations of creatine, an ideal imaging result of the four water phantoms 920 may show different CEST effects. The image 940 provides a representation of the water phantom 910 close to the ideal imaging result of the water phantom 910. However, the image 950 provides a representation of the water phantom 910 that deviates from the ideal imaging result of the water phantom 910. Specifically, the image 950 shows that regions indicated by white arrows 951, 952, and 953 have an CEST effect, respectively, which may be caused by the inhomogeneity of the $B_0$ field in regions indicated by black arrows 931, 932, and 933 as illustrated in the image 930. Therefore, by correcting the $MTR_{asym}$ with respect to inhomogeneity in the $B_0$ field using the $B_0$ map, the image result may be more accurate.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB. NET, Python or the like, conventional procedural programming languages, such as the "C" programming language, Visual Basic, Fortran 2103, Perl, COBOL 2102, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±1%, ±5%, ±10%, or ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A magnetic resonance imaging (MRI) system, comprising:
at least one storage device including a set of instructions;

at least one processor in communication with the at least one storage device, wherein when executing the set of instructions, the at least one processor is configured to cause the system to perform operations including:
obtaining a plurality of signals relating to a region of interest (ROI) of an object acquired by applying to the object a plurality of chemical exchange and saturation transfer (CEST) preparations with a plurality of offset frequencies, the plurality of signals relating to the ROI being acquired based on a multitasking technique;
generating an image of the ROI based on the plurality of signals; and
sending the image to a terminal for display, wherein
the plurality of CEST preparations are configured to excite proton exchange of a substance in the ROI;
the plurality of CEST preparations are divided into one or more groups, each of the one or more groups comprising multiple CEST preparations with a same offset frequency among the plurality of offset frequencies; and
after a last CEST preparation in each of the one or more groups is applied to the object, the substance reaches a saturation degree that exceeds a saturation threshold.

2. A magnetic resonance imaging (MRI) method implemented on a computing device having at least one processor and at least one storage device, comprising:
obtaining a plurality of signals relating to a region of interest (ROI) of an object acquired by applying to the object a plurality of chemical exchange and saturation transfer (CEST) preparations with a plurality of offset frequencies, the plurality of signals relating to the ROI being acquired based on a multitasking technique;
generating an image of the ROI based on the plurality of signals; and
sending the image to a terminal for display, wherein
the plurality of CEST preparations are configured to excite proton exchange of a substance in the ROI;
the plurality of CEST preparations are divided into one or more groups, each of the one or more groups comprising multiple CEST preparations with a same offset frequency among the plurality of offset frequencies; and
after a last CEST preparation in each of the one or more groups is applied to the object, the substance reaches a saturation degree that exceeds a saturation threshold.

3. A non-transitory computer readable medium, comprising at least one set of instructions for magnetic resonance imaging (MRI), wherein when executed by at least one processor of a computing device, the at least one set of instructions cause the at least one processor to effectuate a method comprising:
obtaining a plurality of signals relating to a region of interest (ROI) of an object acquired by applying to the object a plurality of chemical exchange and saturation transfer (CEST) preparations with a plurality of offset frequencies, the plurality of signals relating to the ROI being acquired based on a multitasking technique;
generating an image of the ROI based on the plurality of signals; and
sending the image to a terminal for display, wherein
the plurality of CEST preparations are configured to excite proton exchange of a substance in the ROI;
the plurality of CEST preparations are divided into one or more groups, each of the one or more groups comprising multiple CEST preparations with a same offset frequency among the plurality of offset frequencies; and
after a last CEST preparation in each of the one or more groups is applied to the object, the substance reaches a saturation degree that exceeds a saturation threshold.

4. The system of claim 1, wherein the plurality of offset frequencies of the CEST preparations are within one or more discrete frequency ranges.

5. The system of claim 4, wherein the one or more discrete frequency ranges include at least one of:
a frequency range centered at or containing a resonant frequency of the substance,
a frequency range centered at or containing a negative value of the resonant frequency of the substance, or
a frequency range whose characteristic frequency is different from a resonant frequency of water by a threshold frequency.

6. The system of claim 1, wherein the plurality of offset frequencies exclude a resonant frequency of water.

7. The system of claim 1, wherein the applying to the object a plurality of CEST preparations with a plurality of offset frequencies includes:
after multiple CEST preparations in one of the one or more groups are applied, applying multiple CEST preparations in another group of the one or more groups.

8. The system of claim 1, wherein a duration of the CEST preparation is smaller than a threshold relating to a characteristic time of a physiological motion of the ROI.

9. The system of claim 1, wherein the acquisition of a plurality of signals relating to an ROI of an object by applying to the object a plurality of CEST preparations with a plurality of offset frequencies includes:
after each of the plurality of CEST preparations is applied to the object, acquiring multiple signal pairs of the plurality of signals, each signal pair including at least one first signal and at least one second signal, wherein
the at least one first signal is used to estimate temporal information of the ROI of the object during the acquisition of the plurality of signals; and
the at least one second signal corresponds to image data for generating the image of the ROI.

10. The system of claim 9, wherein
each CEST preparation of at least one of the plurality of CEST preparations includes a double echo sequence; and
each of at least one of the multiple signal pairs includes two first signals and two second signals acquired in response to the double echo sequence.

11. The system of claim 10, wherein the generating an image of the ROI based on the plurality of signals includes:
determining a tensor relating to the ROI based on the plurality of signals; and
generating the image of the ROI based on the tensor.

12. The system of claim 11, wherein the tensor includes at least one of
a first component representing an echo dimension of each CEST preparation,
a second component representing a pixel matrix of the image,
a third component representing a count of the plurality of offset frequencies, or
a fourth component representing a count of multiple CEST preparations in each of the one or more groups.

13. The system of claim 12, wherein the generating the image of the ROI based on the tensor includes:

generating a $B_0$ map based on the tensor; and
generating the image of the ROI based on the $B_0$ map and the tensor.

14. The system of claim 13, wherein the generating a $B_0$ map based on the tensor includes:
   determining a first phase difference between the at least one first signal and a second phase difference between the at least one second signal of each of the at least one of the multiple signal pairs acquired after the each CEST preparation is applied; and
   generating the $B_0$ map based on the first phase differences, the second phase differences, the second component, the third component, and the fourth component.

15. The system of claim 13, wherein the tensor further includes at least one of:
   a fifth component representing a count of cardiac phases of a cardiac cycle of the object, or
   a sixth component representing a count of respiratory phases of a respiratory cycle of the object.

16. The system of claim 15, wherein the generating a $B_0$ map based on the tensor includes:
   determining a first phase difference between the at least one first signal and a second phase difference between the at least one second signal of each of the at least one of the multiple signal pairs acquired after the each CEST preparation is applied;
   generating an averaging result by averaging reference $B_0$ maps that are determined based on values of the fifth component and reference $B_0$ maps that are determined based on values of the sixth component; and
   generating the $B_0$ map based on the first phase differences, the second phase differences, the second component, the third component, the fourth component, and the averaging result.

17. The system of claim 13, wherein the generating the image of the ROI based on the $B_0$ map and the tensor includes:
   correcting, based on the $B_0$ map, a magnetization transfer ratio asymmetry ($MTR_{asym}$) relating to the ROI; and
   generating the image based on the corrected $MTR_{asym}$.

18. The system of claim 17, wherein the correcting, based on the $B_0$ map, a magnetization transfer ratio asymmetry ($MTR_{asym}$) relating to the ROI includes:
   determining multiple deviation values relating to multiple reference offset frequencies based on the $B_0$ map;
   determining multiple target offset frequencies among the plurality of offset frequencies based on the multiple deviation values and the multiple reference offset frequencies, each of the multiple target offset frequencies being equal to a sum of one of the multiple reference offset frequencies and a deviation value corresponding to the reference offset frequency; and
   correcting the $MTR_{asym}$ relating to the ROI based on the multiple target offset frequencies and multiple signals corresponding to the multiple target offset frequencies among the plurality of signals.

19. The system of claim 18, wherein each of the multiple signals corresponding to one of the multiple target offset frequencies includes a signal acquired after the application to the object the last CEST preparation of the target offset frequency.

* * * * *